(12) United States Patent
Hong

(10) Patent No.: US 10,545,888 B2
(45) Date of Patent: Jan. 28, 2020

(54) DATA INVERSION CIRCUIT

(71) Applicant: SK hynix Inc., Icheon-si, Gyeonggi-do (KR)

(72) Inventor: Yun Gi Hong, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 301 days.

(21) Appl. No.: 15/493,666

(22) Filed: Apr. 21, 2017

(65) Prior Publication Data

US 2018/0143922 A1    May 24, 2018

(30) Foreign Application Priority Data

Nov. 21, 2016 (KR) .......................... 10-2016-0155117

(51) Int. Cl.
*G11C 7/22* (2006.01)
*G06F 13/16* (2006.01)
*G11C 7/10* (2006.01)

(52) U.S. Cl.
CPC ........ *G06F 13/1689* (2013.01); *G11C 7/1087* (2013.01); *G11C 7/22* (2013.01)

(58) Field of Classification Search
None
See application file for complete search history.

(56) References Cited

U.S. PATENT DOCUMENTS

| | | | | |
|---|---|---|---|---|
| 7,280,412 | B2* | 10/2007 | Jang | G11C 7/1006 326/26 |
| 7,522,073 | B1* | 4/2009 | Kao | H03M 5/145 341/55 |
| 8,064,283 | B2* | 11/2011 | Kwak | G11C 7/02 365/189.05 |
| 8,094,045 | B2* | 1/2012 | Hollis | G06F 13/4234 341/58 |
| 8,510,490 | B2* | 8/2013 | Abbasfar | G06F 13/4265 341/50 |
| 2009/0193319 | A1* | 7/2009 | Shen | G06F 11/10 714/777 |
| 2010/0118618 | A1 | 5/2010 | Kwak | |
| 2014/0140145 | A1* | 5/2014 | Taruishi | G11C 7/1066 365/189.05 |
| 2014/0281075 | A1 | 9/2014 | Hollis | |
| 2017/0075854 | A1 | 3/2017 | Hollis | |
| 2017/0337951 | A1* | 11/2017 | Hollis | G11C 5/04 |

FOREIGN PATENT DOCUMENTS

| | | |
|---|---|---|
| KR | 100974223 B1 | 8/2010 |
| KR | 1020150132296 A | 11/2015 |
| WO | 2014150529 A1 | 9/2014 |

* cited by examiner

*Primary Examiner* — Elias Mamo
(74) *Attorney, Agent, or Firm* — William Park & Associates Ltd.

(57) ABSTRACT

A data inversion circuit in accordance with an embodiment may include a data input circuit and an inversion latch circuit. The data input circuit may output latch data by latching input data, perform a data inversion by performing a logical operation on the latch data and flag data, generate selective inversion data, and output data composed of multiple bits by aligning the selective inversion data. The inversion latch circuit may generate the flag data by latching inversion data.

20 Claims, 5 Drawing Sheets

DATA INVERSION CIRCUIT

CROSS-REFERENCE TO RELATED APPLICATION

This application claims priority under 35 U.S.C 119(a) to Korean patent application number 10-2016-0155117 filed on Nov. 21, 2016, the disclosure of which is incorporated herein by reference in its entirety.

BACKGROUND

Embodiments of the present disclosure may generally relate to a data inversion circuit, and more particularly to a data bus inversion circuit that is smaller in size while reducing power consumption.

A semiconductor integrated circuit (IC) may include a semiconductor memory device that stores data therein in response to a control signal from a Central Processing Unit (CPU) or a Graphics Processing Unit (GPU). One of the factors that may affect performance of the semiconductor IC such as a main memory or a graphic memory is a data processing speed.

Examples of various technologies that can reduce power consumption of the semiconductor IC may include a data bus inversion circuit. For example, when a controller during a write operation or a semiconductor memory device during a read operation is sending out data, if the number of bits having "0" (logic low value) in a data byte is five or more, then the data bus inversion circuit inverts the entire byte. By contrast, if at least five bits in a data byte are "1" (logic high value), then the data bus inversion circuit does not invert the data byte.

The semiconductor memory device receives data through a data bus during a write operation and transmits the data over global input/output (I/O) lines. However, if the total number of signals transitioning at the global I/O lines by the data bus inversion circuit increases, an unnecessary toggle current may be generated. Therefore, in sending data by using the data bus inversion circuit, it is importance to minimize the total number of signals transitioning to reduce a toggle current of a transmit (Tx) channel.

SUMMARY

In accordance with an embodiment of the present disclosure, a data inversion circuit may include a data input circuit and an inversion latch circuit. The data input circuit may output latch data by latching input data, perform a data inversion by performing a logical operation on the latch data and flag data, generate selective inversion data, and output data composed of multiple bits by aligning the selective inversion data. The inversion latch circuit may generate the flag data by latching inversion data.

In accordance with an embodiment of the present disclosure, a data inversion circuit may include a latch circuit, a data inversion circuit, an alignment circuit, and a drive circuit. The latch circuit may output first latch data by latching input data in response to a first data strobe signal, latch the input data in response to a second data strobe signal, which is an inversion signal of the first data strobe signal, and output second latch data. The data inversion circuit may output first selective inversion data by performing a logical operation on the first latch data and first flag data, and output second selective inversion data by performing a logical operation on the second latch data and second flag data. The alignment circuit may align the first selective inversion data in synchronization with the first data strobe signal, align the second selective inversion data by synchronizing with the second data strobe signal, and output aligned data in response to a strobe signal. The drive circuit may drive the aligned data in synchronization with an enable signal, and output data composed of multiple bits.

DETAILED DESCRIPTION

Reference will now be made in detail to embodiments of the present disclosure, examples of which are illustrated in the accompanying drawings. Wherever possible, the same reference numbers are used throughout the drawings to refer to the same or like portions.

Figure 1:
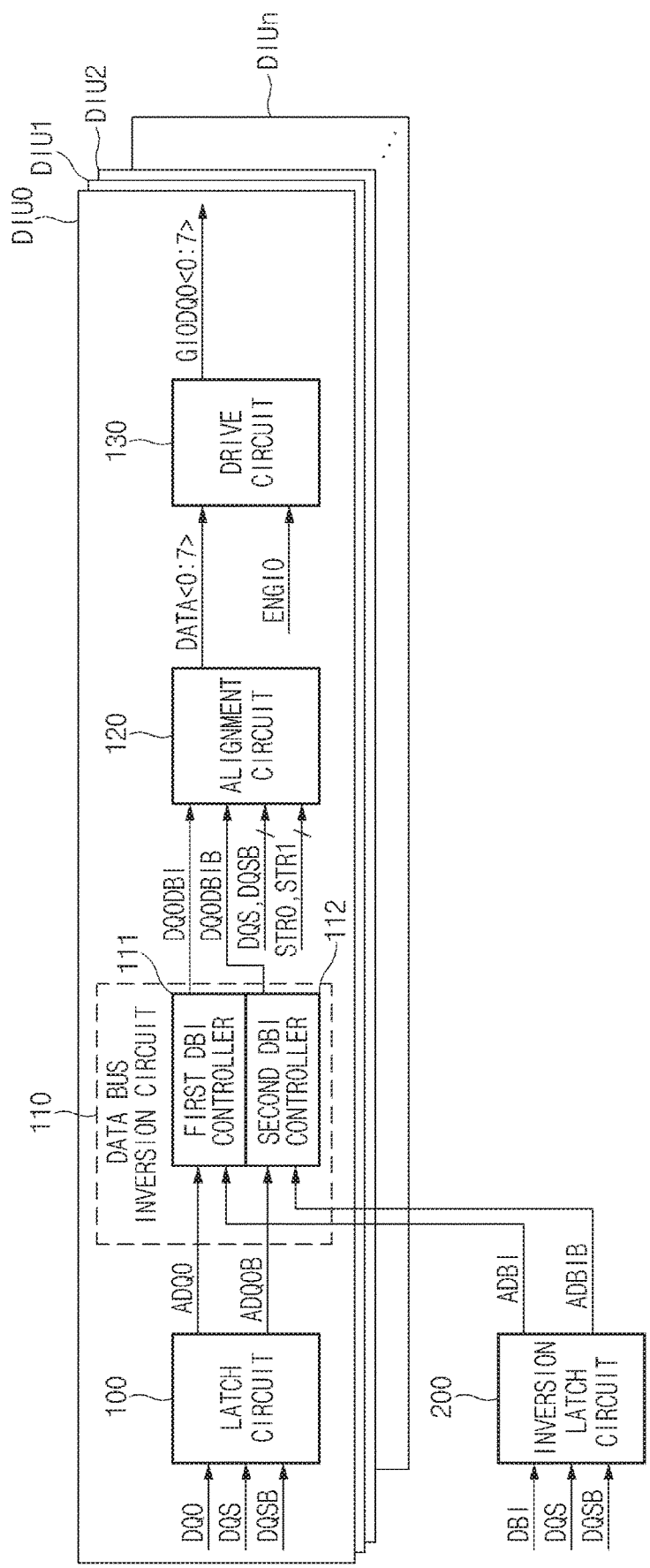
FIG. 1 is a diagram illustrating an example of an input buffer circuit according to an embodiment of the present disclosure.

FIG. 1 is a diagram illustrating an example of an input buffer circuit according to an embodiment of the present disclosure.

Referring to FIG. 1, the data inversion circuit according to an embodiment of the present disclosure may include a plurality of data input circuits DIU0 to DIUn and an inversion latch circuit 200. The inversion latch circuit 200 may be shared by the plurality of data input circuits DIU0 to DIUn.

The data input circuits DIU0 to DIUn are identical in structure to one another, and thus references hereinafter to any single one of the data input circuits DIU0 to DIUn may be interpreted to apply to each of the data input circuits DIU0 to DIUn.

For example, it is assumed that the number of data input circuits DIU0 to DIUn is set to eight (8) and the number of output data segments of each of the data input circuits DIU0 to DIUn is set to eight (8). The data input circuit DIU0 may receive input data DQ0, and may output data GIODQ0<0:7> to global input/output (I/O) lines. Here, the data input circuit DIU0 selectively may invert the received input data DQ0. Likewise, the remaining data input circuits DIU1 to DIU7 may receive data DQ<1:7>, and may respectively output data GIODQ1<0:7> to GIODQ7<0:7> to the global I/O lines. Here, the data input circuits DIU1 to DIU7 may selectively invert the received data DQ<1:7>.

The data input circuit DIU0 may include a latch circuit 100, a data inversion circuit 110, an alignment circuit 120, and a drive circuit 130.

The latch circuit 100 may latch input data DQ0 based on a first data strobe signal DQS, and may output first latch data ADQ0. The latch circuit 100 may latch input data DQ0 based on a second data strobe signal DQSB, and may output second latch data ADQ0B. Here, the second data strobe signal DQSB and the first data strobe signal DQS may have opposite phase. The second latch data ADQ0B may have a value obtained by inverting all the bits in the binary representation of the first latch data ADQ0.

The data inversion circuit 110 may selectively invert the first latch data ADQ0 and/or the second ADQ0B based on first flag data ADBI and/or second flag data ADBIB, and may output first and second selective inversion data DQ0DBI or DQ0DBIB. Here, the second flag data ADBIB may have a value obtained by inverting all the bits in the binary representation of the first flag data ADBI.

The data inversion circuit 110 may include a first data bus inversion (DBI) controller 111 and a second DBI controller 112. The first DBI controller 111 may generate the first selective inversion data DQ0DBI by performing a logical operation on the first flag data ADBI and the first latch data ADQ0. The second DBI controller 112 may generate the second selective inversion data DQ0DBIB by performing a logical operation on the second flag data ADBIB and the second latch data ADQ0B.

Each of the first and second DBI controllers 111 and 112 may include an exclusive NOR (XNOR) gate. That is, if two input data signals have the same logic value, the DBI controllers 111 and 112 may output a logic-high signal. If two input data signals have different logic values, the DBI controllers 111 and 112 may output a logic-low signal.

The first DBI controller 111 may perform an XNOR operation on the first flag data ADBI and the first latch data ADQ0. If the first flag data ADBI and the first latch data ADQ0 have the same logic level, the first DBI controller 111 may output a logic-high signal as the first selective inversion data DQ0DBI. In this case, a logic level of the first flag data ADBI applied to the first DBI controller 111 may be determined depending on inversion data DBI. For example, if the inversion data DBI is a logic-low signal, the first flag data ADBI has a logic low level, and thus the first latch data ADQ0 is inverted. In contrast, if the inversion data DBI is a logic-high signal, the first flag data ADBI has a logic high level, and thus the first latch data ADQ0 is not inverted.

The second DBI controller 112 may perform an XNOR operation on the second flag data ADBIB and the second latch data ADQ0B. If the second flag data ADBIB and the second latch data ADQ0B have the same logic level, the second DBI controller 112 may output a logic-high signal as the second selective inversion data DQ0DBIB. In this case, a logic level of the second flag data ADBIB applied to the second DBI controller 112 may be determined depending on the inversion data DBI. For example, if the inversion data DBI is a logic-low signal, the second flag data ADBIB has a logic low level, and thus the second latch data ADQ0B is inverted. In contrast, if the inversion data DBI is a logic-high signal, the second flag data ADBIB has a logic high level, and thus the second latch data ADQ0B is not inverted.

As discussed above, each of the first and second DBI controllers 111 and 112 may include an XNOR operator. However, the scope of the present disclosure is not limited thereto, and each of the first and second DBI controllers 111 and 112 may be implemented using a multiplexer and/or a pipe latch.

The alignment circuit 120 may align the first and/or second selective inversion data DQ0DBI and/or DQ0DBIB based on a first data strobe signal DQS and/or a second data strobe signal DQSB.

The alignment circuit 120 may output data DATA0<0:7> in synchronization with first and second strobe signals STR0 and STR1. Although the data DATA0<0:7> in this example consists of eight bits, the scope of the present disclosure is not limited thereto, and the number of bits constituting the data may vary. In this case, the first and second strobe signals STR0 and STR1 may be generated in response to a write command (or a read command). The second strobe signal STR1 may be generated after one or more clock cycles subsequent to the first strobe signal STR0. The second strobe signal STR1 may be generated by delaying the first strobe signal STR0.

The drive circuit 130 may drive data DATA0<0:7> received from the alignment circuit 120, and may output data GIODQ0<0:7> to the global I/O lines (GIO) in synchronization with an enable signal ENGIO. Here, the drive circuit 120 may be contained in a write driver for transmitting data DATA0<0:7> received from the alignment circuit 120 to the global I/O lines (GIO). The global I/O lines (not illustrated) may be coupled between the drive circuit 130 and a memory cell region (not illustrated).

In addition, the inversion latch circuit 200 may latch the inversion data DBI based on the first and second data strobe signals DQS and DQSB, and may output the first and second flag data ADBI and ADBIB to the data inversion circuit 110. Here, the inversion data DBI may be received through DBI pins.

The semiconductor memory device may store data, and may output the stored data. The semiconductor memory device uses Data Bus Inversion (DBI) technology to reduce the amount of current generated during data transmission. The DBI technology may minimize the number of transitions of data signals during a data transmission to help in power optimizations.

For example, it is assumed that the amount of current consumption during a transmission of logic-low data is larger than the amount of current consumption during a transmission of logic-high data. As discussed above, the data inversion may be performed if the number of logic-low bits in the data is larger than the number of logic-high bits in the data, but the scope of the present disclosure is not limited thereto.

In an embodiment, if the number of logic-low bits in the data is larger than the number of logic-high bits in the data, the entire bits in the data may be inverted, and these inverted bits are transmitted through a data bus. That is, if logic-low inversion data DBI is input to the semiconductor memory device, the semiconductor memory device inverts data DQ and writes the inverted data DQ in a cell. If logic-high inversion data DBI is input to the semiconductor memory device, the semiconductor memory device may write the data DQ in the cell without inverting the data DQ. Therefore, the semiconductor memory device based on DBI technology may reduce power consumption.

In a data inversion circuit that uses a selection circuit such as a multiplexer to invert data signals to be transmitted over a data bus, the selection circuit may decide whether to invert data signals based on whether inversion data DBI is a logic-high signal or a logic-low signal. Here, using multiplexers as the data inversion circuit may increase the size of a peripheral circuit region.

In addition, if a data inversion circuit aligns input data and delays the aligned data before performing the DBI operation, these preparation steps may increase the time it takes to write data in the cell, and may also increase power consumption. For example, if a data inversion circuit latches input data, aligns the latched data in the form of parallel data composed of multiple bits (e.g., 8 bits), and inverts the multiple bits of the data, then the entire write time increases.

In an embodiment of the present disclosure, however, the DBI operation may be performed using the data inversion circuit 110 instead of using a multiplexer, and thus the size of a peripheral circuit region may decrease. In addition, the data bus inversion may be performed on input data (DQ) and inversion data (DBI) to reduce the time it takes to write data.

Figure 2:
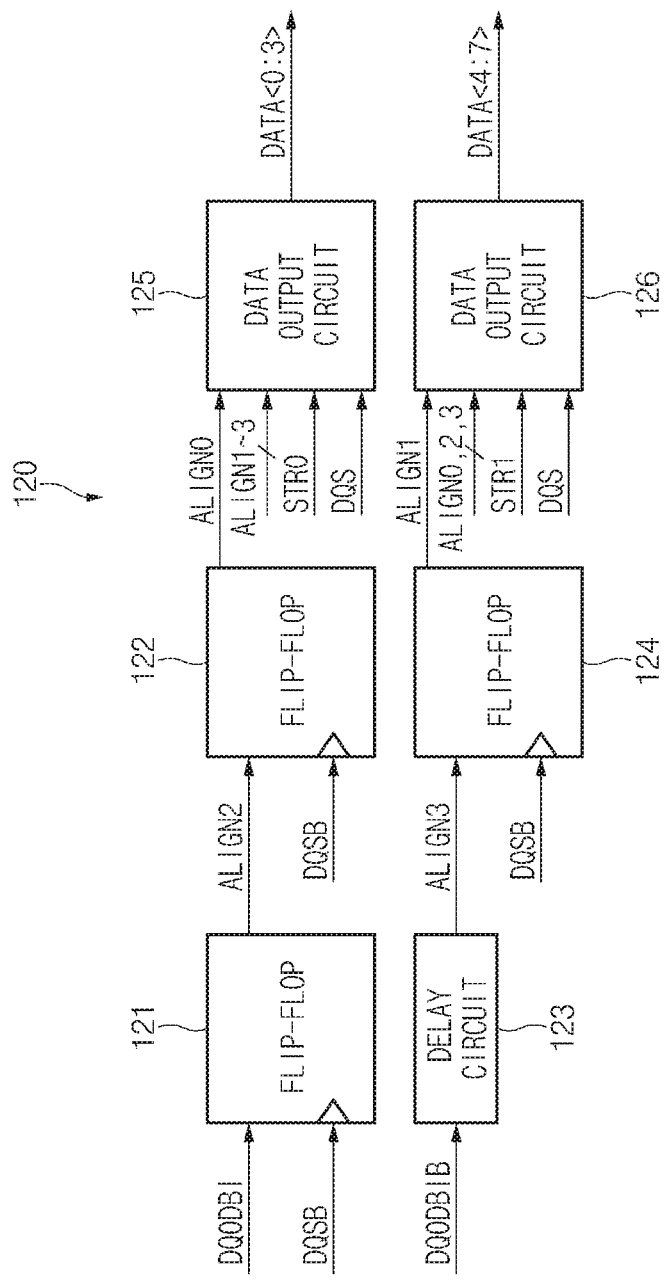
FIG. 2 is a diagram illustrating an example of an alignment circuit of FIG. 1.

FIG. 2 is a diagram illustrating an example of the alignment circuit 120 of FIG. 1.

Referring to FIG. 2, the alignment circuit 120 may include a plurality of flip-flops 121, 122, and 124, a delay circuit 123, and data output circuits 125 and 126.

The flip-flop 121 may hold selective inversion data DQ0DBI in synchronization with a data strobe signal DQSB, and may output alignment data ALIGN2. The flip-flop 122 may hold the alignment data ALIGN2 in synchronization with the data strobe signal DQSB, and may output alignment data ALIGN0.

The delay circuit 123 may delay selective inversion data DQ0DBIB by a predetermined time period, and may output alignment data ALIGN3. The flip-flop 124 may hold the alignment data ALIGN3 in synchronization with the data strobe signal DQSB, and may output alignment data ALIGN1.

The data output circuit 125 may align the alignment data ALIGN0 and the alignment data ALIGN1 to ALIGN3 based on the data strobe signal DQS. The data output circuit 125 may hold the alignment data ALIGN0 to ALIGN3 in response to the strobe signal STR0, and may output data DATA0<0:3>. The data output circuit 125 may output first-group data DATA0<0:3>, the number of bits of which is half the total number of bits of data DATA0<0:7>, in synchronization with the strobe signal STR0, and may output the data DATA0<0:3>.

The data output circuit 126 may align the alignment data ALIGN1 and the alignment data ALIGN0, ALIGN2, and ALIGN3 based on the data strobe signal DQS. The data output circuit 126 may hold the alignment data ALIGN0 to ALIGN3 in response to the strobe signal STR1, and may output data DATA0<4:7>. The data output circuit 126 may output second-group data DATA0<4:7>, the number of bits of which is half the total number of bits of the data DATA0<0:7>, in synchronization with the strobe signal STR1, and may output the data DATA0<4:7>.

Figure 3:
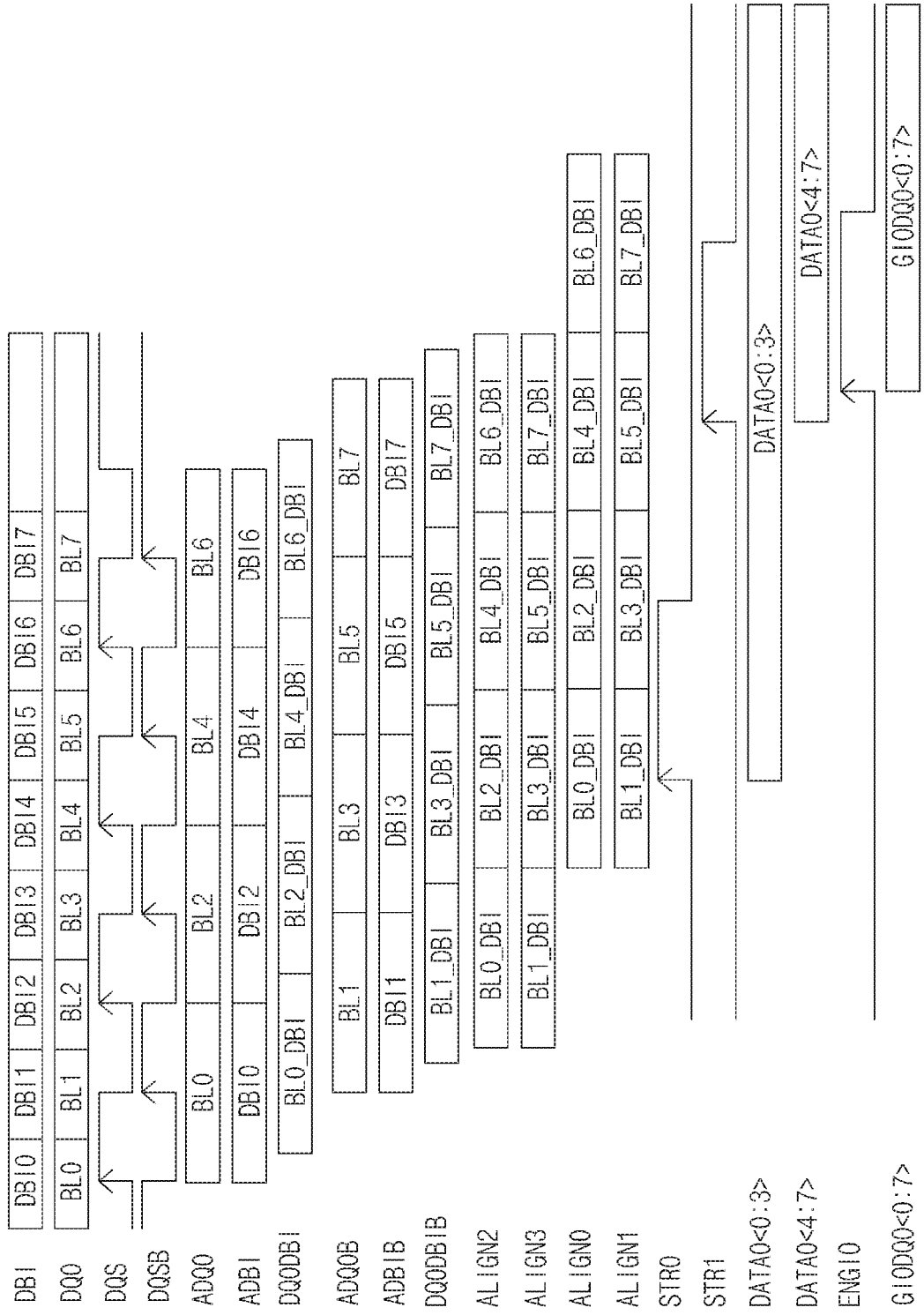
FIG. 3 is a timing diagram illustrating an example of the operation of the data inversion circuit according to an embodiment of the present disclosure.

FIG. 3 is a timing diagram illustrating an example of the operation of the data inversion circuit according to an embodiment of the present disclosure.

Referring to FIG. 3, it is assumed that inversion data DBI applied to the inversion latch circuit 200 consists of eight bits (e.g., DBI0, DBI1, DBI2, DBI3, DBI4, DBI5, DBI6, and DBI7). In addition, it is assumed that input data DQ0 applied to the latch circuit 100 consists of eight bits (e.g., BL0, BL1, BL2, BL3, BL4, BL5, BL6, and BL7).

The latch circuit 100 may latch the input data DQ0 in synchronization with a rising edge of the data strobe signal DQS, and may output the first latch data ADQ0. Here, the latch circuit 100 may latch even numbered bits of the input data BL0, BL2, BL4, and BL6, and may output them as the first latch data ADQ0.

The inversion latch circuit 200 may latch the inversion data DBI in synchronization with the rising edge of the data strobe signal DQS, and may output the first flag data ADBI. Here, the inversion latch circuit 200 may latch even numbered bits of the inversion data DBI0, DBI2, DBI4, and DBI6, and may output them as the first flag data ADBI.

The latch circuit 100 may latch input data DQ0 in synchronization with the rising edge of the data strobe signal DQSB, and may output the second latch data ADQ0B. Here, the latch circuit 100 may latch odd numbered bits of the input data BL1, BL3, BL5, and BL7, and may output them as the second latch data ADQ0B.

The inversion latch circuit 200 may latch the inversion data DBI in synchronization with the rising edge of the data strobe signal DQSB, and may output the second flag data ADBIB. Here, the inversion latch circuit 200 may latch odd numbered bits of the inversion data DBI1, DBI3, DBI5, and DBI7, and may output them as the second flag data ADBIB.

Thereafter, the DBI controller 111 may output the first selective inversion data DQ0DBI by performing a logic operation on the first flag data ADBI and the first latch data ADQ0. Here, the first selective inversion data DQ0DBI may include even numbered bits of DBI-processed data BL0_DBI, BL2_DBI, BL4_DBI, and BL6_DBI.

The DBI controller 112 may output the second selective inversion data DQ0DBIB by performing a logic operation on the second flag data ADBIB and the second latch data ADQ0B. Here, the second selective inversion data DQ0DBIB may include odd numbered bits of the DBI-processed data BL1_DBI, BL3_DBI, BL5_DBI, and BL7_DBI.

Subsequently, the flip-flop 121 may hold the first selective inversion data DQ0DBI in response to the data strobe signal DQSB, and may output alignment data ALIGN2. The delay circuit 123 may delay the second selective inversion data DQ0DBIB by a predetermined time period, and may output the alignment data ALIGN3. Here, the delay circuit 123 may delay the second selective inversion data DQ0DBIB until the alignment data ALIGN3 is aligned with the alignment data ALIGN2.

That is, the alignment data ALIGN2 and the alignment data ALIGN3 may be delayed until when the setup time matches the hold time subsequent to the rising edge. Even numbered data bit BL0_DBI may be synchronized with odd numbered data bit BL1_DBI, and even numbered data bit BL2_DBI may be synchronized with odd numbered data bit BL3_DBI. Even numbered data bit BL4_DBI may be synchronized with odd numbered data bit BL5_DBI, and even numbered data bit BL6_DBI may be synchronized with odd numbered data bit BL7_DBI.

After that, the flip-flop 122 may hold the alignment data ALIGN2 in response to the data strobe signal DQSB, and may thus output alignment data ALIGN0. The flip-flop 124 may hold the alignment data ALIGN3 in response to the data strobe signal DQSB, and may output the alignment data ALIGN1. Here, the alignment data ALIGN0 and the alignment data ALIGN1 may be delayed more than the alignment data ALIGN2 and alignment data ALIGN3 by a single clock, and may then be output. Therefore, "BL0_DBI" as the alignment data ALIGN0 may be aligned with "BL1_DBI" as the alignment data ALIGN1, and "BL2_DBI" as the alignment data ALIGN2 may be aligned with "BL3_DBI" as the alignment data ALIGN3.

Thereafter, if the strobe signal STR0 is activated, the data output circuit 125 may combine the plurality of alignment data bits ALIGN0 to ALIGN3, and may output data DATA0<0:3>. If the strobe signal STR1 is activated, the data output circuit 126 may combine the plurality of alignment data bits ALIGN0 to ALIGN3, and may output data DATA0<4:7>. Here, the second strobe signal STR1 is activated later than the strobe signal STR0.

After that, if the enable signal ENGIO is activated, the drive circuit 130 may drive data DATA0<0:7>, and may output the driven data DATA0<0:7> to the global I/O lines. Here, the enable signal ENGIO may be activated later than the second strobe signal STR1.

Figure 4:
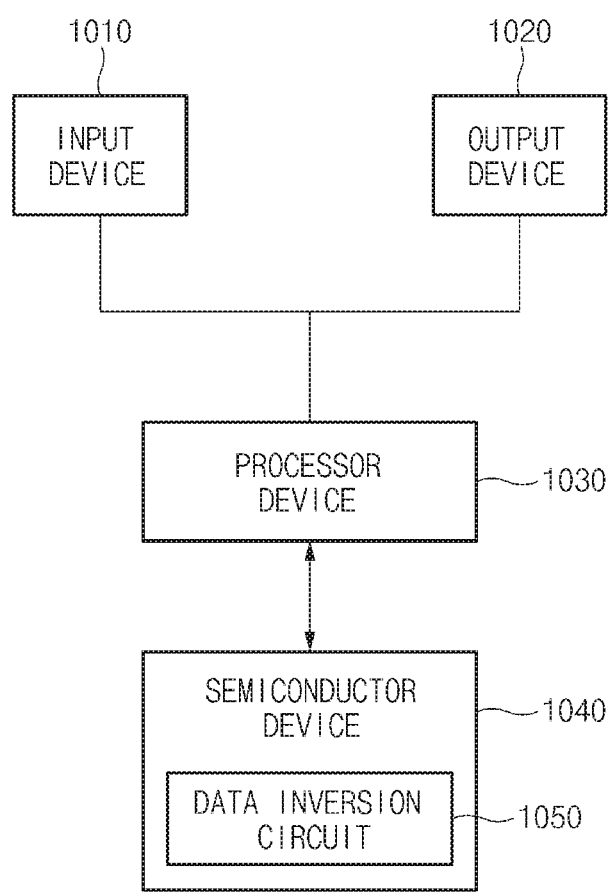
FIG. 4 is a diagram illustrating an application example of an electronic system including the data inversion circuit according to an embodiment of the present disclosure.

FIG. 4 is a diagram illustrating an application example of an electronic system including the data inversion circuit according to an embodiment of the present disclosure.

Referring to FIG. 4, the electronic system 1000 may include an input device 1010, an output device 1020, a processor device 1030, and a semiconductor device 1040. Here, the processor device 1030 may control the input device 1010, the output device 1020, and the semiconductor device 1040 through the corresponding interfaces.

The processor device 1030 may include one or more of microprocessor, digital signal processor, microcontroller, and logic circuits capable of performing the same or similar functions as these components.

Examples of the input device 1010 may include a keyboard, a mouse, a keypad, a touchscreen, a scanner, and so forth. Examples of the output device 1020 may include a monitor, a speaker, a printer, a display device, and so forth. The semiconductor device 1040 may include the data inversion circuit 1050 in accordance with an embodiment.

Figure 5:
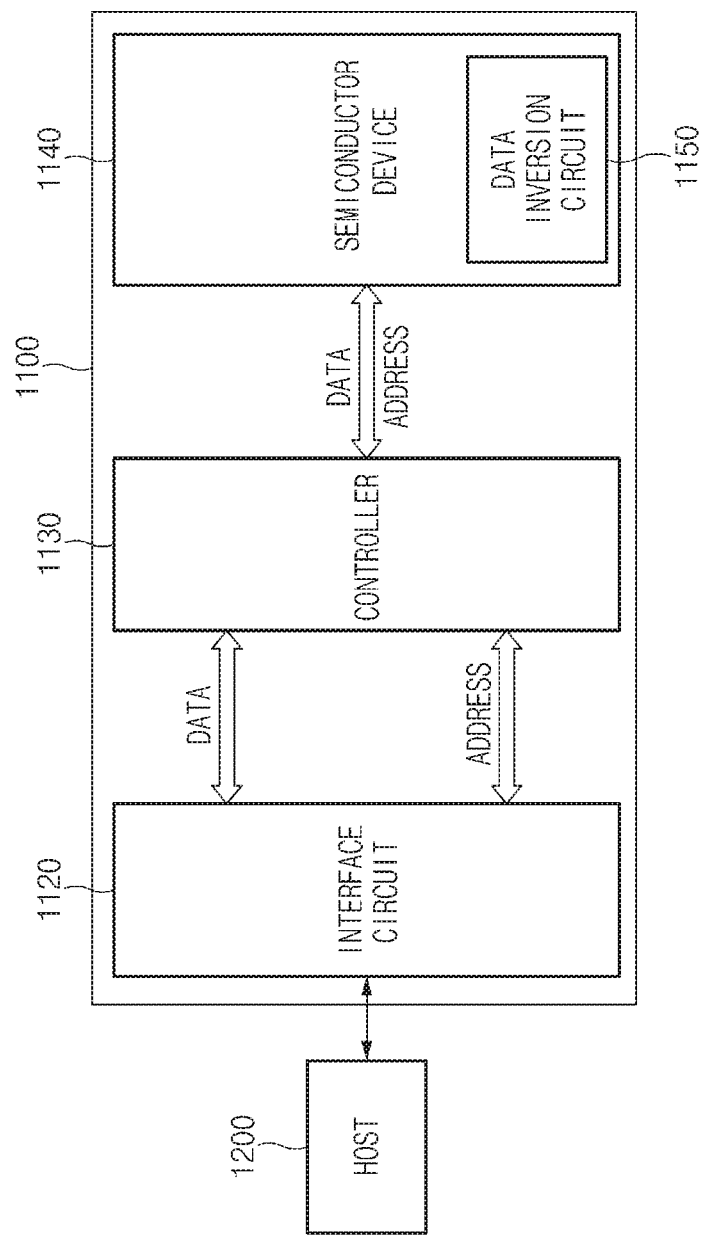
FIG. 5 is a diagram illustrating an example of a memory system using the semiconductor device according to an embodiment of the present disclosure.

FIG. 5 is a diagram illustrating an example of a memory system using the semiconductor device according to an embodiment of the present disclosure.

Referring to FIG. 5, the memory system 1100 may include a semiconductor device 1140, an interface circuit 1120, and a controller 1130.

The interface circuit 1120 may provide an interface for the host 1200 to interact with the memory system 1110. The interface circuit 1120 may include a data exchange protocol corresponding to the host 1200.

The interface circuit 1120 may communicate with the host 1200 through one of various interface protocols such as a Universal Serial Bus (USB) protocol, a Multimedia Card (MMC) protocol, a Peripheral Component Interconnect-Express (PCI-E) protocol, a Serial Attached SCSI (SAS) protocol, a Serial Advanced Technology Attachment (SATA) protocol, a Parallel Advanced Technology Attachment (PATA) protocol, a Small Computer System Interface (SCSI) protocol, an Enhanced Small Disk Interface (ESDI), and an Integrated Drive Electronics (IDE) protocol.

The controller 1130 may receive data and address from an external device through the interface circuit 1120. The controller 1130 may access the semiconductor device 1140 according to address signals received from the host 1200. The controller 1130 may transfer data read from the semiconductor device 1140 to the host 1200 through the interface circuit 1120.

The semiconductor device 1140 may include the data inversion circuit 1150 illustrated in FIGS. 1 to 3. The semiconductor device 1140 may be used as a storage medium of the memory system 1100.

The memory system 1100 illustrated in FIG. 5 may be used as a data storage device of information processing devices, for example, a personal digital assistant (PDA), a portable computer, a web tablet, a digital camera, a portable media player (PMP), a mobile phone, a wireless phone, a laptop computer, etc. The memory system 1100 may be any of a multimedia card (MMC), a Secure Digital (SD) card, a micro SD card, a memory stick, an ID card, a Personal Computer Memory Card International Association (PCM-CIA) card, a chip card, a USB card, a smart card, a Compact Flash (CF) Card, etc.

As is apparent from the above description, the data inversion circuit according to an embodiment of the present disclosure latches input data, performs data bus inversion, and performs alignment, and thus the size of a peripheral circuit region may decrease, and power consumption of the data inversion circuit may also be reduced.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A data inversion circuit comprising:
   a data input circuit configured to output latch data by latching input data, perform a data inversion by performing a logical operation on the latch data and flag data, generate selective inversion data, and output data composed of multiple bits by aligning the selective inversion data; and
   an inversion latch circuit configured to generate the flag data by latching inversion data,
   wherein the data input circuit includes;
   a first data bus inversion controller configured to output a first selective inversion data by performing a logical operation on a first latch data and a first flag data; and
   a second data bus inversion controller configured to output a second selective inversion data by performing a logical operation on a second latch data and a second flag data.

2. The data inversion circuit according to claim 1, wherein the data inversion circuit includes a plurality of data input circuits, the inversion latch circuit is shared by the plurality of data input circuits.

3. The data inversion circuit according to claim 1, wherein the data input circuit includes:
   a latch circuit configured to latch the input data in response to a data strobe signal, and output first latch data and second latch data;
   a data bus inversion circuit configured to output first selective inversion data by performing a logical operation on the first latch data and first flag data, and output second selective inversion data by performing a logical operation on the second latch data and second flag data;
   an alignment circuit configured to align the first selective inversion data and the second selective inversion data in synchronization with the data strobe signal, and output the aligned data in response to a strobe signal; and
   a drive circuit configured to drive the aligned data in synchronization with an enable signal, and output data composed of multiple bits.

4. The data inversion circuit according to claim 3, wherein:
   the first latch data is synchronized with a rising edge of the data strobe signal; and the second latch data is synchronized with a rising edge of an inversion signal of the data strobe signal.

5. The data inversion circuit according to claim 3, wherein:
the first flag data is synchronized with a rising edge of the data strobe signal; and
the second flag data is synchronized with a rising edge of an inversion signal of the data strobe signal.

6. The data inversion circuit according to claim 3, wherein:
the data bus inversion circuit outputs a logic-high signal when two input data signals have the same logic level; and
the data bus inversion circuit outputs a logic-low signal when two input data signals have different logic levels.

7. The data inversion circuit according to claim 3, wherein the data bus inversion circuit includes a logic gate configured to perform an exclusive NOR operation on two input data signals.

8. The data inversion circuit according to claim 7, wherein the alignment circuit includes:
a first flip-flop configured to hold the first selective inversion data in synchronization with the data strobe signal, and output first alignment data;
a delay circuit configured to output second alignment data by delaying the second selective inversion data;
a second flip-flop configured to hold the first alignment data in synchronization with the data strobe signal, and output third alignment data;
a third flip-flop configured to hold the second alignment data in synchronization with the data strobe signal, and output fourth alignment data;
a first data output circuit configured to latch the first to fourth alignment data, and output data of a first group in synchronization with a first strobe signal; and
a second data output circuit configured to latch the first to fourth alignment data, and output data of a second group in synchronization with a second strobe signal.

9. The data inversion circuit according to claim 8, wherein the first alignment data and the second alignment data are output based on a first rising edge of the data strobe signal.

10. The data inversion circuit according to claim 8, wherein the third alignment data and the fourth alignment data are output based on a second rising edge of the data strobe signal.

11. The data inversion circuit according to claim 8, wherein the second strobe signal is activated later than the first strobe signal by a predetermined time period.

12. The data inversion circuit according to claim 8, wherein the enable signal is activated later than the second strobe signal by a predetermined time period.

13. A data inversion circuit comprising:
a latch circuit configured to output first latch data by latching input data in response to a first data strobe signal, latch the input data in response to a second data strobe signal, which is an inversion signal of the first data strobe signal, and output second latch data;
a first data bus inversion controller configured to output the first selective inversion data by performing a logical operation on the first latch data and the first flag data;
a second data bus inversion controller configured to output the second selective inversion data by performing a logical operation on the second latch data and the second flag data;
an alignment circuit configured to align the first selective inversion data by synchronizing with the first data strobe signal, align the second selective inversion data in synchronization with the second data strobe signal, and output aligned data in response to a strobe signal; and
a drive circuit configured to drive the aligned data in synchronization with an enable signal, and output data composed of multiple bits.

14. The data inversion circuit according to claim 13, further comprising an inversion latch circuit configured to generate the first flag data by latching inversion data in response to the first data strobe signal, and generate the second flag data by latching the inversion data in response to the second data strobe signal.

15. The data inversion circuit according to claim 13, wherein:
the first latch data and the first flag data are synchronized with a rising edge of the first data strobe signal; and
the second latch data and the second flag data are synchronized with a rising edge of the second data strobe signal.

16. The data inversion circuit according to claim 13, wherein each of the first data bus inversion controller and the second data bus inversion controller includes a logic gate configured to perform an exclusive NOR operation on two input data.

17. The data inversion circuit according to claim 13, wherein the alignment circuit includes:
a first flip-flop configured to hold the first selective inversion data in synchronization with the second data strobe signal, and output first alignment data;
a delay circuit configured to output second alignment data by delaying the second selective inversion data;
a second flip-flop configured to hold the first alignment data in synchronization with the second data strobe signal, and output third alignment data;
a third flip-flop configured to hold the second alignment data in synchronization with the second data strobe signal, and output fourth alignment data;
a first data output circuit configured to latch the first to fourth alignment data, and output data of a first group in synchronization with a first strobe signal; and
a second data output circuit configured to latch the first to fourth alignment data, and output data of a second group in synchronization with a second strobe signal.

18. The data inversion circuit according to claim 17, wherein:
the second strobe signal is activated later than the first strobe signal by a predetermined time period; and
the enable signal is activated later than the second strobe signal by a predetermined time period.

19. The data inversion circuit according to claim 13, wherein:
the first flag data is synchronized with a rising edge of the data strobe signal; and
the second flag data is synchronized with a rising edge of an inversion signal of the data strobe signal.

20. The data inversion circuit according to claim 13, wherein:
each of the first data bus inversion controller and the second data bus inversion controller outputs a logic-high signal when two input data signals have the same logic level; and
each of the first data bus inversion controller and the second data bus inversion controller outputs a logic-low signal when two input data signals have different logic levels.

* * * * *